(12) United States Patent
Eshrah

(10) Patent No.: US 12,388,540 B2
(45) Date of Patent: Aug. 12, 2025

(54) APPARATUS AND METHODS FOR ELECTRONIC TESTING USING BEAMFORMING INTEGRATED CIRCUITS AS IMPEDANCE TUNERS

(71) Applicant: Analog Devices International Unlimited Company, Limerick (IE)

(72) Inventor: Islam A. Eshrah, Giza (EG)

(73) Assignee: Analog Devices International Unlimited Company, Limerick (IE)

( * ) Notice: Subject to any disclaimer, the term of this patent is extended or adjusted under 35 U.S.C. 154(b) by 410 days.

(21) Appl. No.: 18/168,873

(22) Filed: Feb. 14, 2023

(65) Prior Publication Data

US 2024/0275500 A1    Aug. 15, 2024

(51) Int. Cl.
*H04B 17/00* (2015.01)
*G01R 27/28* (2006.01)
*G01R 31/28* (2006.01)

(52) U.S. Cl.
CPC ......... *H04B 17/0085* (2013.01); *G01R 27/28* (2013.01); *G01R 31/2822* (2013.01)

(58) Field of Classification Search
CPC .............. H04B 17/0085; G01R 27/28; G01R 31/2822
USPC ...................................... 455/67.14
See application file for complete search history.

(56) References Cited

U.S. PATENT DOCUMENTS

| | | | | |
|---|---|---|---|---|
| 2012/0229230 A1* | 9/2012 | Mei | ...................... | H03F 1/0288 333/116 |
| 2017/0019170 A1* | 1/2017 | Lee | ...................... | H04B 10/11 |
| 2023/0019522 A1* | 1/2023 | Magers | ................... | G01R 27/06 |
| 2023/0280395 A1* | 9/2023 | Munzer | .............. | G01R 31/2856 324/750.3 |

OTHER PUBLICATIONS

Bae et al., "A Programmable Impedance Tuner with a High Resolution Using a 0.18-um CMOS SOI Process for Improved Linearity" Electronics 2020, 9, 7, in 9 pages.
Dudkiewicz, S., "Vector-Receiver Load Pull Measurement" Maury Microwave Corporation dated Mar. 2011 in 5 pages.
Simpson, G., "Impedance Tuning 101" Microwaves and RF dated Dec. 1, 2014 in 7 pages.
Whatley et al., Reconfigurable RF Impedance Tuner for Match Control in Broadband Wireless Devices, IEEE Transactions on Antennas and Propagation, vol. 54, No. 2 dated Feb. 2006, in 10 pages.

* cited by examiner

*Primary Examiner* — Don N Vo
(74) *Attorney, Agent, or Firm* — Knobbe, Martens, Olson & Bear, LLP

(57) ABSTRACT

Apparatus and methods for electronic testing using beamforming integrated circuits (ICs) as impedance tuners are disclosed herein. In certain embodiments, an electronic testing setup for a device-under-test (DUT) includes a radio frequency (RF) coupler including a through line connected to an output of the DUT, a first coupled line coupled to the through line, and a second coupled line coupled to the through line. Additionally, the electronic testing setup includes a beamforming IC including a first transmit channel having an output connected to the first coupled line, and a second transmit channel having an output connected to the second coupled line. A gain and a phase of the first transmit channel and a gain and a phase of the second transmit channel are each controllable to provide impedance tuning at the output of the DUT.

20 Claims, 8 Drawing Sheets

APPARATUS AND METHODS FOR ELECTRONIC TESTING USING BEAMFORMING INTEGRATED CIRCUITS AS IMPEDANCE TUNERS

FIELD OF THE DISCLOSURE

Embodiments of the invention relate to electronics, and more particularly, to electronic testing of radio frequency (RF) components.

BACKGROUND

RF amplifiers can be used in a wide variety of applications to amplify RF signals. Example applications using RF amplifiers include radar, satellite, military, and/or cellular communications.

To provide a performance assessment of an RF amplifier, the RF amplifier can be tested in a variety of ways. For instance, one example of an electronic test for an RF amplifier is load-pull in which an impedance presented to the RF amplifier's output is varied to assess performance under different loading conditions.

SUMMARY OF THE DISCLOSURE

Apparatus and methods for electronic testing using beamforming integrated circuits (ICs) as impedance tuners are disclosed herein. In certain embodiments, an electronic testing setup for a device-under-test (DUT) includes a radio frequency (RF) coupler including a through line connected to an output of the DUT, a first coupled line coupled to the through line, and a second coupled line coupled to the through line. Additionally, the electronic testing setup includes a beamforming IC including a first transmit channel having an output connected to the first coupled line, and a second transmit channel having an output connected to the second coupled line. A gain and a phase of the first transmit channel and a gain and a phase of the second transmit channel are each controllable to provide impedance tuning at the output of the DUT. By implementing the electronic test setup in this manner, a need for external impedance tuners is avoided. Thus, a low cost and compact testing solution is achieved. Moreover, such a testing setup reduces errors arising from losses and/or permits testing at high frequencies such as millimeter wave frequencies and/or frequency range 2 (FR2) of 5G.

In one aspect, an electronic testing setup includes an RF coupler including a through line, a first coupled line coupled to the through line, and a second coupled line coupled to the through line. The through line is configured to receive an RF output signal from an output of a DUT. Additionally, electronic testing setup includes a beamforming IC including a first transmit channel having an output connected to the first coupled line, and a second transmit channel having an output connected to the second coupled line. A gain and a phase of the first transmit channel and a gain and a phase of the second transmit channel are each controllable to provide impedance tuning at the output of the DUT.

In another aspect, a circuit board assembly for electronic testing is provided. The circuit board assembly includes a circuit board including an RF coupler formed thereon, the RF coupler including a through line, a first coupled line coupled to the through line, and a second coupled line coupled to the through line. The through line is configured to receive an RF signal from an output of a DUT. The circuit board assembly further includes a beamforming IC attached to the circuit board, the beamforming IC including a first transmit channel having an output connected to the first coupled line, and a second transmit channel having an output connected to the second coupled line. A gain and a phase of the first transmit channel and a gain and a phase of the second transmit channel are each controllable to provide impedance tuning at the output of the DUT.

In another aspect, a method of electronic testing is provided. The method includes providing an RF output signal from an output of a DUT to a through line of an RF coupler, driving a first coupled line of the RF coupler using an output of a first transmit channel of a beamforming IC, and driving a second coupled line of the RF coupler using an output of a second transmit channel of the beamforming IC. The first coupled line is coupled to the through line, and the second coupled line is coupled to the through line. The method further includes providing impedance tuning at the output of the DUT by controlling each of a gain and a phase of the first transmit channel and a gain and a phase of the second transmit channel.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Example Phased Array Antenna System and RF Front End for Beamforming

Figure 1:
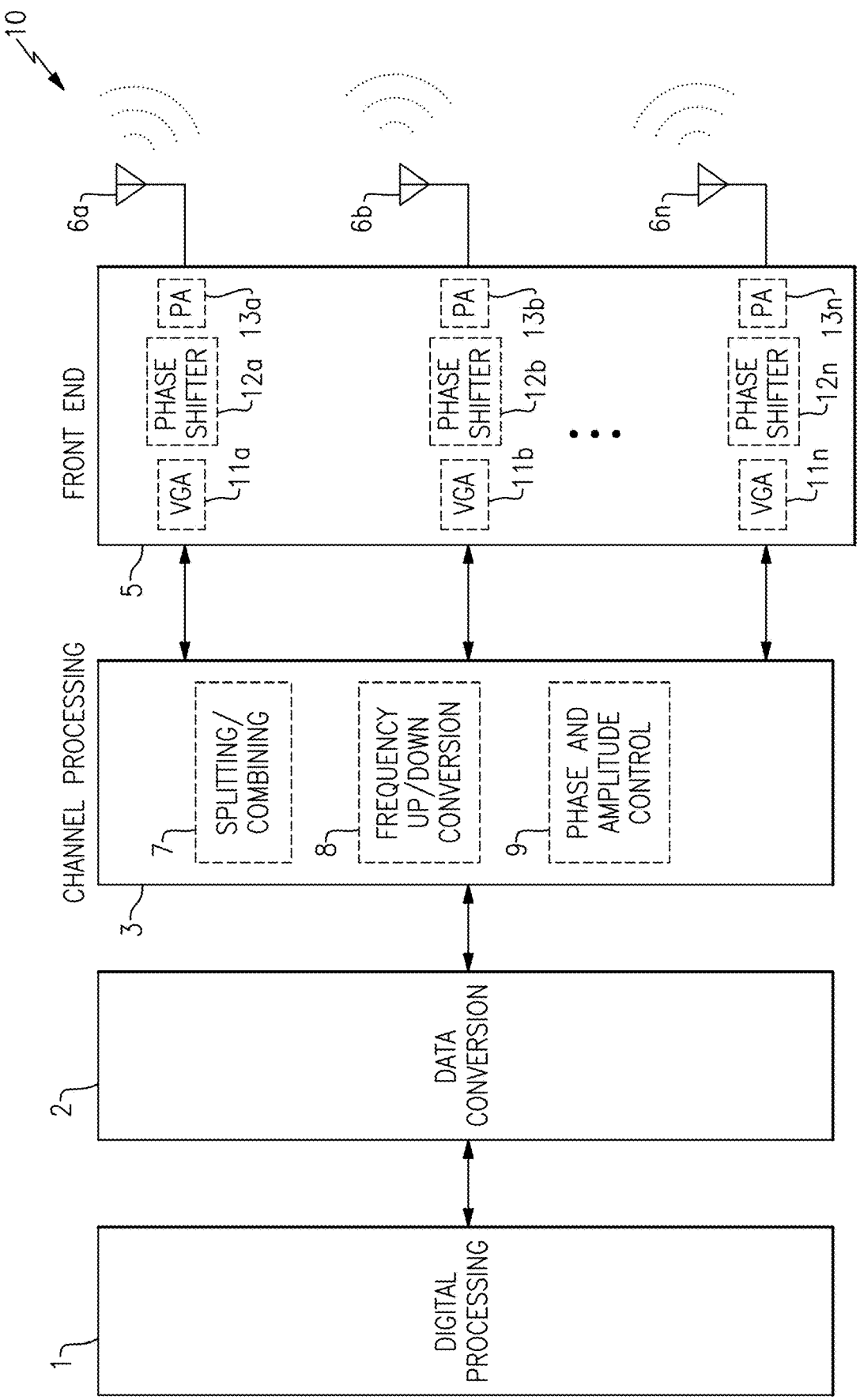
FIG. 1 is a schematic diagram of one embodiment of a phased array antenna system operating with beamforming.

FIG. 1 is a schematic diagram of one embodiment of a phased array antenna system 10 operating with beamforming. The phased array antenna system 10 includes a digital processing circuit 1, a data conversion circuit 2, a channel processing circuit 3, an RF front end 5, and antennas 6a, 6b, . . . 6n.

Although an example system with three antennas is illustrated, the phased array antenna system 10 can include more or fewer antennas as indicated by the ellipses. Furthermore, in certain implementations, the phased array antenna system 10 is implemented with separate antennas for transmitting and receiving signals. Such antennas can be arrayed, for instance, in a square or rectangular array in some implementations.

The phased array antenna system 10 illustrates one embodiment of an electronic system that can include one or more beamforming ICs. However, beamforming ICs can be used in a wide range of electronics. A phased array antenna system is also referred to herein as an active scanned electronically steered array or beamforming communication system.

As shown in FIG. 1, the channel processing circuit 3 is connected to antennas 6a, 6b, . . . 6n through the RF front end 5, which includes variable gain amplifiers (VGAs) 11a, 11b, . . . 11n and phase shifters 12a, 12b, . . . 12n for providing gain control and phase control for the antennas 6a, 6b, . . . 6n, respectively. Additionally, the RF front end 5 includes power amplifiers (PAs) for amplifying RF signals for transmission on the antennas 6a, 6b, . . . 6n. Any number of antennas, VGAs, phase shifters, and/or power amplifiers can be included. Furthermore, the RF front end 5 can include other components not depicted including, but not limited to, low noise amplifiers amplifying RF signals received from the antennas 6a, 6b, . . . 6n.

With continuing reference to FIG. 1, the digital processing circuit 1 generates digital transmit data for controlling a transmit beam radiated from the antennas 6a, 6b, . . . 6n. The digital processing circuit 1 also can process digital receive data representing a receive beam. In certain implementations, the digital processing circuit 1 includes one or more baseband processors.

As shown in FIG. 1, the digital processing circuit 1 is connected to the data conversion circuit 2, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 8 provides frequency upshifting from baseband to RF and frequency downshifting from RF to baseband, in this embodiment. However, other implementations are possible, such as configurations in which the phased array antenna system 10 operates in part at an intermediate frequency (IF). In certain implementations, the splitting/combining circuit 7 provides splitting to one or more frequency upshifted transmit signals to generate RF signals suitable for processing by the RF front end 5 and subsequent transmission on the antennas 6a, 6b, . . . 6n. Additionally, the splitting/combining circuit 7 combines RF signals received vias the antennas 6a, 6b, . . . 6n and RF front end 5 to generate one or more baseband receive signals for the data conversion circuit 2.

The channel processing circuit 3 also includes the phase and amplitude control circuit 9 for controlling beamforming operations. For example, the phase and amplitude control circuit 9 controls the amplitudes and phases of RF signals transmitted or received via the antennas 6a, 6b, . . . 6n to provide beamforming. With respect to signal transmission, the RF signal waves radiated from the antennas 6a, 6b, . . . 6n aggregate through constructive and destructive interference to collectively generate a transmit beam having a particular direction. With respect to signal reception, the channel processing circuit 3 generates a receive beam by combining the RF signals received from the antennas 6a, 6b, . . . 6n after amplitude scaling and phase shifting.

Phased array antenna systems are used in a wide variety of applications including, but not limited to, mobile communications, military and defense systems, and/or radar technology.

As shown in FIG. 1, the RF front end 5 includes VGAs 11a, 11b, . . . 11n, which are used to scale the amplitude of RF signals transmitted or received by the antennas 6a, 6b, . . . 6n, respectively. Additionally, the RF front end 5 includes phase shifters 12a, 12b, . . . 12n, respectively, for phase-shifting the RF signals. For example, in certain implementations the phase and amplitude control circuit 9 generates gain control signals for controlling the amount of gain provided by the VGAs 11a, 11b, . . . 11n and phase control signals for controlling the amount of phase shifting provided by the phase shifters 12a, 12b, . . . 12n.

The phased array antenna system 10 operates to generate a transmit beam and/or receive beam including a main lobe pointed in a desired direction of communication. The phased array antenna system 10 realizes increased signal to noise (SNR) ratio in the direction of the main lobe. The transmit beam and/or receive beam also includes one or more side lobes, which point in different directions than the main lobe and are undesirable.

An accuracy of beam direction of the phased array antenna system 10 is based on a precision in controlling the gain and phases of the RF signals communicated via the antennas 6a, 6b, . . . 6n. For example, when one or more of the RF signals has a large phase error, the beam can be broken and/or pointed in an incorrect direction. Furthermore, the size or magnitude of beam side lobe levels is based on an accuracy in controlling the phases and amplitudes of the RF signals.

Accordingly, it is desirable to tightly control the phase and amplitude of RF signals communicated by the antennas 6a, 6b, . . . 6n to provide robust beamforming operations.

Figure 2:
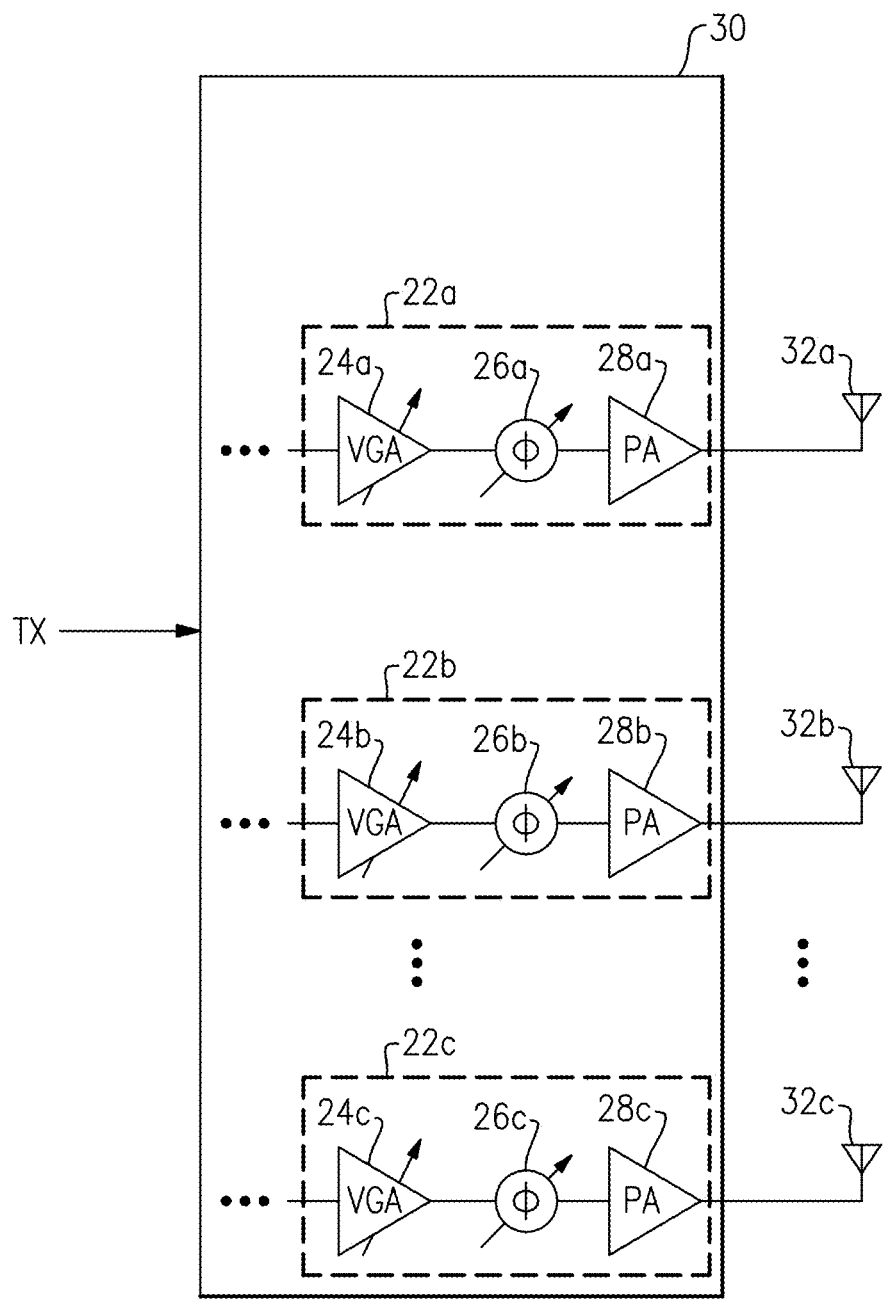
FIG. 2 is a schematic diagram of one embodiment of a front end system for beamforming a transmit beam.

FIG. 2 is a schematic diagram of one embodiment of a front end system 30 for beamforming a transmit beam. The front end system 30 depicts one example of a circuit that can be formed on a semiconductor die to serve as a beamforming IC.

In the illustrated embodiment, the front end system 30 includes a first transmit channel 22a, a second transmit channel 22b, and a third transmit channel 22c. Although three transmit channels are depicted, the front end system 30 can include additional transmit channels as indicated by the ellipses. Furthermore, the front end system 30 can include further components not shown in FIG. 2, including but not limited to, receive channels for processing RF receive signals.

With continuing reference to FIG. 2, the first transmit channel 22a includes a first VGA 24a, a first controllable phase shifter 26a (also referred to herein as a vector modulator or VM), and a first power amplifier 28a in cascade. Additionally, the second transmit channel 22b includes a second VGA 24b, a second controllable phase shifter 26b, and a second power amplifier 28b in cascade. Furthermore, the third transmit channel 22c includes a third VGA 24c, a third controllable phase shifter 26c, and a third power amplifier 28c in cascade. Although example components for the transmit channels are depicted, other implementations of the transmit channels are possible. For example, the order of the components can be varied and/or the transmit channels can include additional components.

In the illustrated embodiment, the front end system 30 is connected to an antenna array including a first antenna 32a, a second antenna 32b, and a third antenna 32c. Although three antennas and three transmit channels are depicted, other numbers of antennas and transmit channels are possible.

As shown in FIG. 2, the front end system 30 receives a transmit signal TX, which can be provided (for instance, using an RF splitter) to each of the transmit channels 22a-22c. The transmit channels 22a-22c have separately controllable gain and phase to separately adjust the gain and phase of RF output signals provided to the antennas 32a-32c. Although not shown in FIG. 2, the front end system 30 can further be implemented to process RF receive signals from the receive antennas 32a-32c (or from separate antennas) to generate a receive signal.

Electronic Testing Using Beamforming ICs as Impedance Tuners

Various RF components undergo electronic testing for a variety of reasons, including characterization. For example, it is important to understand the behavior of the RF component when exposed to varying operating conditions, since the component's behavior can be significantly different under these conditions. A semiconductor die (also referred to herein as an IC) that is undergoing electronic testing is referred to herein as a device-under-test (DUT).

One example of electronic testing for RF components is load-pull, in which the impedance presented to a DUT, typically a power amplifier, is varied to assess performance under different loading conditions. Typical test measurement setups for load-pull use complex impedance tuners to change the impedance seen by the power amplifier to conduct a load-pull analysis of output power. For example, the impedance tuners can correspond to off-board components (external impedance tuners) needing special calibration for proper de-embedding of the impedance seen by the power amplifier. Such external impedance tuners can have a complex and bulky structure to achieve suitable control range of the impedance whether mechanically or electronically.

Conventional load-pull measurement schemes can be unsuitable for a wide range of applications. For instance, load-pull measurements can be difficult to conduct at millimeter wave frequencies due to limitations in precision and/or frequency in the impedance tuners.

Furthermore, even when such impedance tuners are available, the tuners are external and thus calibration of the cables, connectors and routing is prone to many errors.

In applications such as cellular fifth generation (5G) millimeter wave (mmW) phased arrays, the impedance of a given transmit channel of the phased array is varied inherently when the antenna array is phased to different beam positions by virtue of the mutual coupling between the antenna elements of the antenna array.

Thus, beamforming ICs used in phased antenna array modules (PAAM), experience load-pull as the active antenna impedance is varied under beam scan due to the finite isolation between the antenna array elements.

To mimic or emulate such an environment, an intentional coupling mechanism can be implemented on a printed circuit board (PCB) so that the active impedance seen by the power amplifier under test is varied and the load-pull process is conducted. This can be referred to herein as self-impedance tuning.

Apparatus and methods for electronic testing using beamforming ICs as impedance tuners are disclosed herein. In certain embodiments, an electronic testing setup for a DUT includes an RF coupler including a through line connected to an output of the DUT, a first coupled line coupled to the through line, and a second coupled line coupled to the through line. Additionally, the electronic testing setup includes a beamforming IC including a first transmit channel having an output connected to the first coupled line, and a second transmit channel having an output connected to the second coupled line. A gain and a phase of the first transmit channel and a gain and a phase of the second transmit channel are each controllable to provide impedance tuning at the output of the DUT.

Accordingly, the transmit channels of a beamforming IC drive coupled lines of an RF coupler to provide impedance tuning for a DUT. By implementing the electronic test setup in this manner, a need for external impedance tuners is avoided. Thus, a low cost and compact testing solution is achieved. Moreover, such a testing setup reduces errors arising from losses and/or permits testing at high frequencies such as millimeter wave frequencies and/or frequency range 2 (FR2) of 5G.

In certain implementations, the beamforming IC itself is the DUT. Thus, the first and second transmit channels of the beamforming IC can be used to provide impedance tuning to a third transmit channel of the beamforming IC. In certain implementations, each transmit channel of a beamforming IC (which can have any number of transmit channels, for instance 4, 8, or 16 or more) is sequentially tested using two other transmit channels of the beamforming IC, the selection of which changes over time depending on which transmit channel is undergoing test at a particular time. Accordingly, the beamforming IC can participate in its own testing.

In other implementations, the beamforming IC is separate from the DUT, which can correspond to a different RF component (for example, a power amplifier) undergoing test. Accordingly, the teachings herein are applicable both to implementations in which the beamforming IC is used in testing itself as well as to implementations in which the beamforming IC is used in testing other RF components.

Figure 3A:
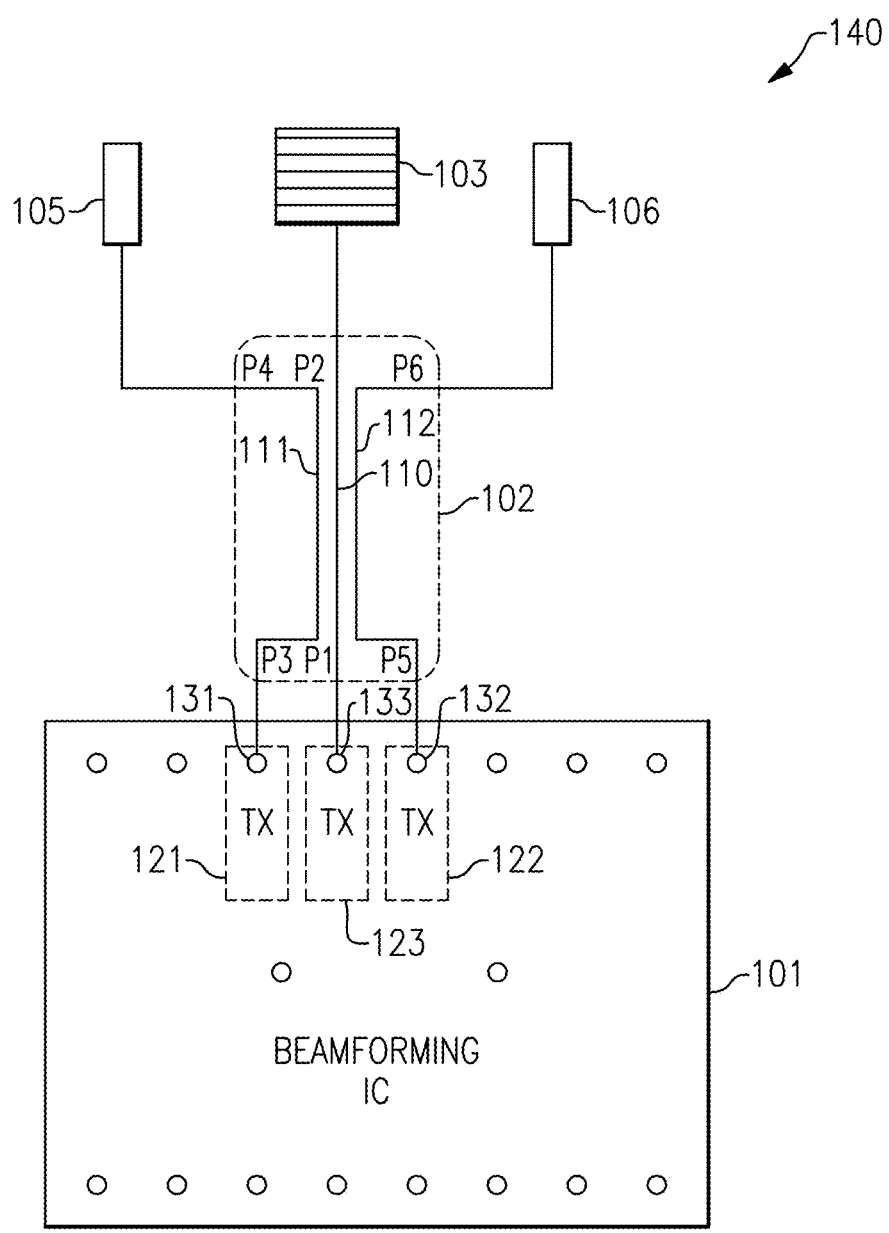
FIG. 3A is a schematic diagram of one embodiment of a test setup using transmit channels of a beamforming integrated circuit (IC) as an impedance tuner for another transmit channel of the beamforming IC.

FIG. 3A is a schematic diagram of one embodiment of a test setup 140 using a beamforming IC 101 as an impedance tuner. As shown in FIG. 3A, the test setup 140 includes the beamforming IC 101, an RF coupler 102, a connector 103, a first termination impedance 105, and a second termination impedance 106.

In the illustrated embodiment, the RF coupler 102 includes a through line 110 connected between a first port P1 and a second port P2, a first coupled line 111 connected between a third port P3 and a fourth port P4, and a second coupled line 112 connected between a fifth port P5 and a sixth port P6. The first coupled line 111 is coupled (for instance, magnetically or electromagnetically coupled) to the through line 110. Likewise, the second coupled line 112 is coupled (for instance, magnetically or electromagnetically coupled) to the through line 110.

In certain implementations, the RF coupler 102 is formed on a circuit board, such as an evaluation board fabricated using printed circuit board (PCB) technology. Additionally, the beamforming IC 101, the connector 103, and/or the termination impedances 105-106 can be attached to the circuit board.

As shown in FIG. 3A, the beamforming IC 101 includes a first transmit channel 121, a second transmit channel 122, and a third transmit channel 123. The beamforming IC 101 further includes various pins or pads including a first pin 131 driven by an output of the first transmit channel 121, a second pin 132 driven by an output of the second transmit channel 122, and a third pin 133 driven by an output of the third transmit channel 123. Although only certain pins and circuits of the beamforming IC 101 are depicted, the beamforming IC 101 can include a number of other pins, circuits, and other structures which are not depicted in FIG. 3A for clarity of the figure.

With continuing reference to FIG. 3A, the through line 110 of the RF coupler 102 connects the output of the third transmit channel 123 of the beamforming IC 101 to the connector 103, which in turn can connect to a desired component such as a power detector. Additionally, the first coupled line 111 of the RF coupler 102 connects the output of the first transmit channel 121 of the beamforming IC 101 to the first termination impedance 105 (for instance, a resistor), while the second coupled line 112 of the RF coupler 102 connects the output of the second transmit channel 122 of the beamforming IC 101 to the second termination impedance 106 (for instance, a resistor).

A gain and a phase of the first transmit channel 121 and a gain and a phase of the second transmit channel 122 are each controllable to provide impedance tuning at the output of the third transmit channel 123. In the illustrated embodiment, the beamforming IC 101 corresponds not only to the impedance tuner for electronic testing (for example, load-pull testing), but also is the DUT. In particular, the first transmit channel 121 and the second transmit channel 122 of the beamforming IC 101 are used to provide impedance tuning to the output of the third transmit channel 123.

Figure 3B:
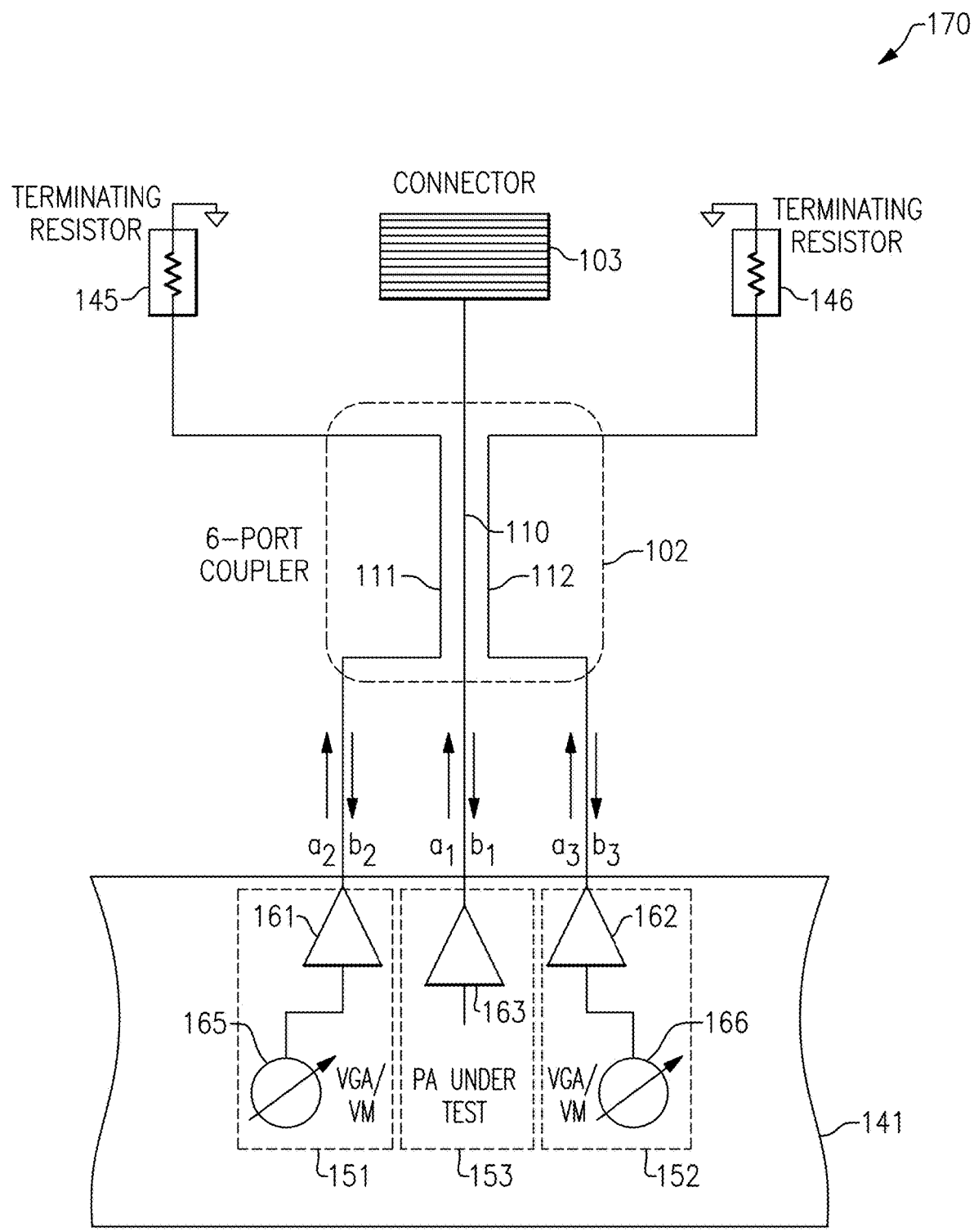
FIG. 3B is a schematic diagram of another embodiment of a test setup using transmit channels of a beamforming IC as an impedance tuner for another transmit channel of the beamforming IC.

FIG. 3B is a schematic diagram of another embodiment of a test setup 170 using a beamforming IC 141 as an impedance tuner. As shown in FIG. 3B, the test setup 170 includes the beamforming IC 141, an RF coupler 102, a connector 103, a first termination resistor 145, and a second termination resistor 146.

The test setup 170 of FIG. 3B is similar to the test setup 140 of FIG. 3A, except that the test setup 170 depicts specific implementations of certain components shown in FIG. 3A.

For example, the beamforming IC 141 of FIG. 3B includes a first transmit channel 151 including a first VGA/VM 165 and a first power amplifier 161 in cascade, a second transmit channel 152 including a second VGA/VM 166 and a second power amplifier 162 in cascade, and a third transmit channel 153 including a third power amplifier 163 under test. Additionally, the impedance presented to the third power amplifier 163 is tuned for testing by the first power amplifier 161 driving the first coupled line 111 (which is terminated by the first resistor 145 connected to ground) and the second power amplifier 162 driving the second coupled line 112 (which is terminated by the second resistor 146 connected to ground).

Accordingly, the phases and/or gains of the signals outputted by the first transmit channel 151 and the second transmit channel 152 are varied to present the desired impedances at the output of the power amplifier 163 under test.

Thus, the beamforming IC 141 is employed as an impedance tuner by varying the gain and phases (for example, of the VGAs and/or VMs) of transmit channels of the beamforming IC. Since these transmit channels are already included as part of the beamforming IC, more compact testing is achieved relative to a configuration using an external impedance tuner. For example, such external impedance tuners are bulky and expensive.

FIG. 3B has also been annotated to show $a_1$ and $b_1$ coefficients for power amplifier 163, $a_2$ and $b_2$ coefficients for power amplifier 161, and $a_3$ and $b_3$ coefficients for power amplifier 162.

Using an S-parameter matrix to model the circuit, the reflection coefficient $\Gamma_1$ can be expressed as $\Gamma_1=b_1/a_1=s_{11}+s_{12}\,a_2/a_1+s_{13}\,a_3/a_1$. When $s_{12}=s_{13}$ and $s_{11}=0$, the reflection coefficient can be expressed as $\Gamma_1=s_{12}(a_3+a_2)/a_1$.

Accordingly, from the previous equations it will be appreciated that the magnitude and phase of the reflection coefficient can be varied depending on the relative values of the RF signals launched by the transmit channels 151-152 and the coupling coefficient of the RF coupler 102.

Figure 4:
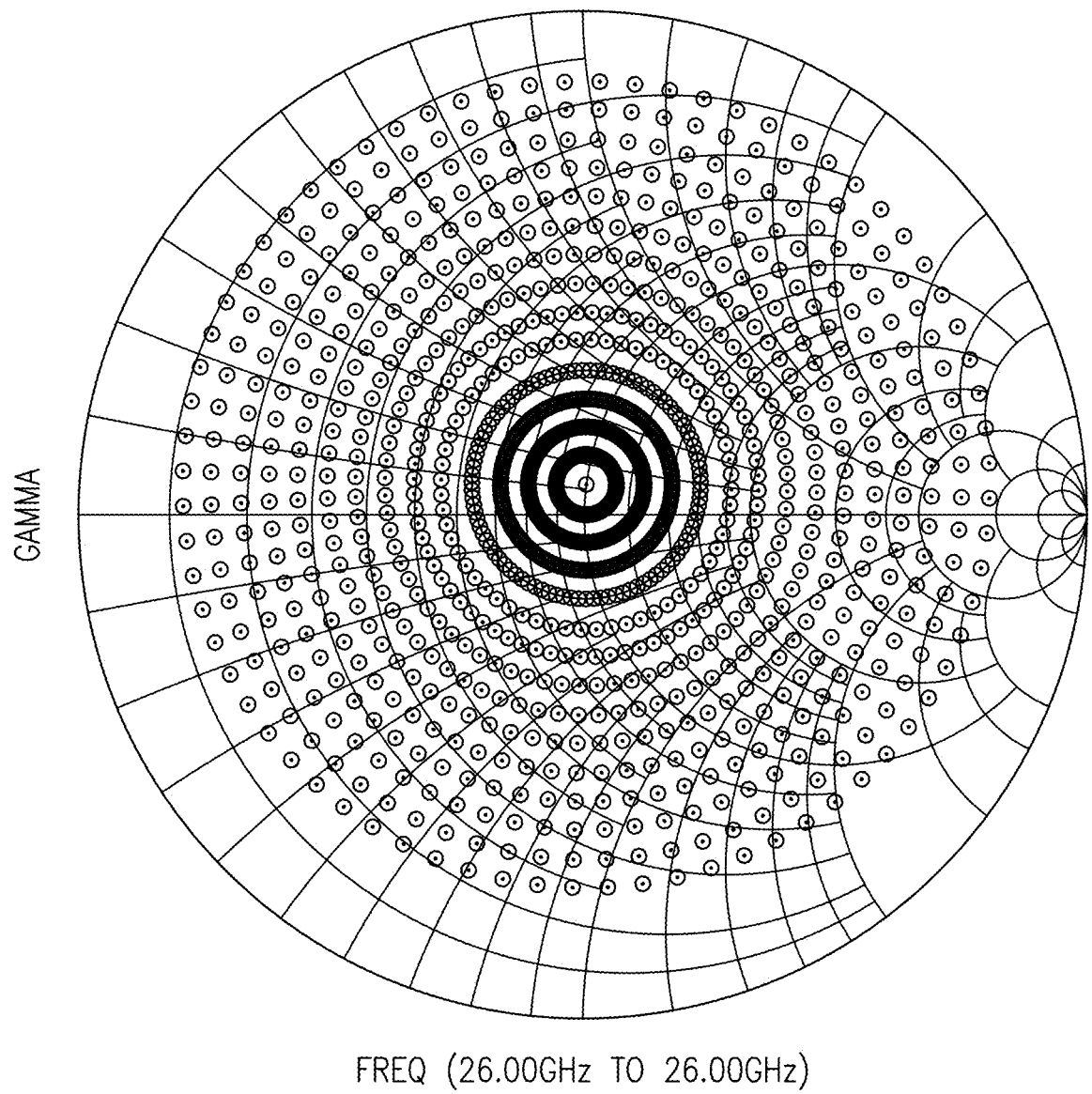
FIG. 4 is a Smith chart depicting one example of testing coverage for a test setup using a beamforming IC as an impedance tuner.

FIG. 4 is a Smith chart depicting one example of testing coverage for a test setup using a beamforming IC as an impedance tuner. The Smith chart depicts sample results at 26 GHz for one implementation of the test setup 170 of FIG. 3B.

To provide impedance tuning, a DUT is loaded with an active load with variable magnitude and phase. In particular, the variable magnitude and phase of the active load allows a sweep of desired power on the Smith chart, with the resulting measurements being used to construct load-pull contours used to characterize the DUT.

As shown in the results of FIG. 5, sweeping the gains and/or phases of adjacent channels of a beamforming IC results in the depicted coverage of the Smith chart, which robustly spans a range of impedance values suitable for generating load-pull contours.

Figure 5A:
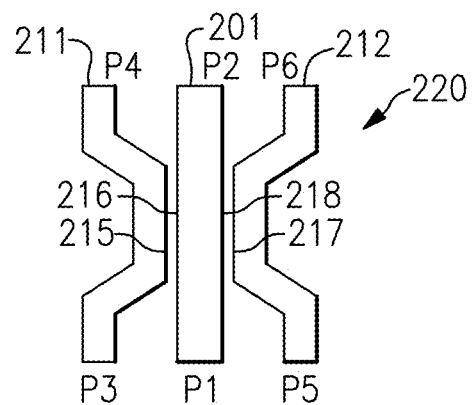
FIG. 5A is a plan view of a six-port coupler with a coupling arrangement according to one embodiment.

FIG. 5A is a plan view of a six-port coupler 220 with a coupling arrangement according to one embodiment. The six-port coupler 220 includes a through line 201 connected between a first port P1 and a second port P2, a first coupled line 211 connected between a third port P3 and a fourth port P4, and a second coupled line 212 connected between a fifth port P5 and a sixth port P6.

In the illustrated embodiment, an edge 215 of the first coupled line 211 is coupled to an edge 216 of the through line 201, and an edge 217 of the second coupled line 212 is coupled to an edge 218 of the through line 201. Thus, the coupling arrangement of FIG. 5A is edge-coupled.

Figure 5B:
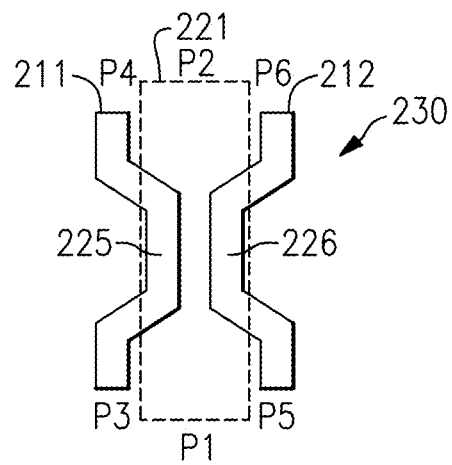
FIG. 5B is a plan view of a six-port coupler with a coupling arrangement according to another embodiment.

FIG. 5B is a plan view of a six-port coupler 230 with a coupling arrangement according to another embodiment. The six-port coupler 230 includes a through line 221 connected between a first port P1 and a second port P2, a first coupled line 211 connected between a third port P3 and a fourth port P4, and a second coupled line 212 connected between a fifth port P5 and a sixth port P6. A broadside 225 of the first coupled line 211 is coupled to the through line 221, and a broadside 226 of the second coupled line 212 is coupled to the through line 221.

In comparison the coupling arrangement of FIG. 5A, the six-port coupler 230 of FIG. 5B uses broadside coupling rather than edge coupling. By providing broadside coupling, greater coverage of the Smith chart can be achieved.

Figure 5C:
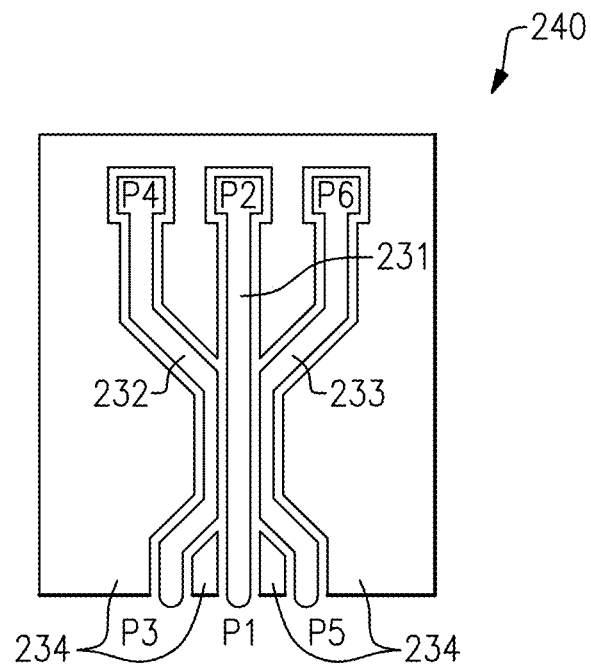
FIG. 5C is a plan view of a six-port coupler according to another embodiment.

FIG. 5C is a plan view of a six-port coupler 240 according to another embodiment. The six-port coupler 240 is implemented in a conductive layer of a circuit board that has been patterned to form a through line 231 connected between a first port P1 and a second port P2, a first coupled line 232 connected between a third port P3 and a fourth port P4, a second coupled line 233 connected between a fifth port P5 and a sixth port P6, and shielding conductors 234, which can be grounded.

The RF couplers herein can be formed in a circuit board, such as an evaluation board formed using PCB technologies.

Although an example with edge-coupling is shown, an RF coupler can also use broadside coupling.

A six-port coupler can be designed to achieve a coupling level suitable for a desired application. For example, a coupling level of the coupler impacts the range of impedances that can be swept on the Smith chart.

An RF coupler, such as the six-port coupler 240 of FIG. 5C, can be characterized after fabrication to provide calibration and/or correlation of the coupler's S-parameters to simulation.

Figure 6:
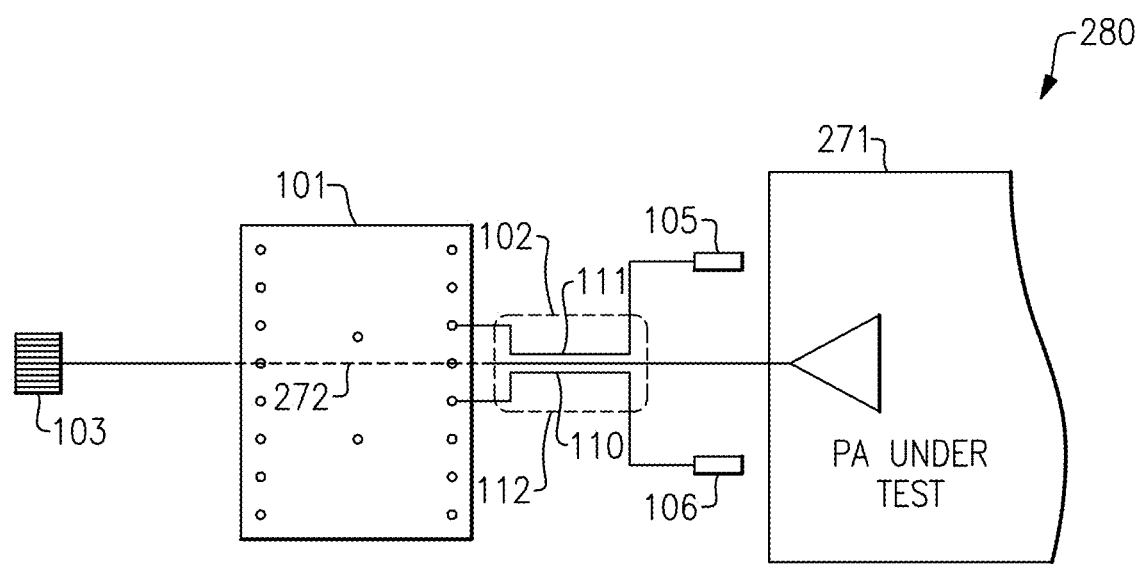
FIG. 6 is a schematic diagram of another embodiment of a test setup using transmit channels of a beamforming IC as an impedance tuner for the power amplifier of another device.

FIG. 6 is a schematic diagram of another embodiment of a test setup 280 using a beamforming IC 101 as an impedance tuner. As shown in FIG. 6, the test setup 280 includes the beamforming IC 101, an RF coupler 102, a connector 103, a first termination impedance 105, a second termination impedance 106, and a DUT 271 (corresponding to a power amplifier, in this example).

The test setup 280 of FIG. 6 is similar to the test setup 140 of FIG. 3A, except that in the test setup 280 of FIG. 6 the DUT 271 is separate from (a different RF component than) the beamforming IC 101.

Accordingly, the beamforming IC 101 is used as an impedance tuner for other DUTs.

As shown in FIG. 6, the through line 110 of the RF coupler 110 connects the output of the DUT 271 to the connector 103. In certain implementations, the DUT 271 is also connected to the connector 103 by way of an internal connection 272 of the beamforming IC 101. However, in other implementations, the internal connection 272 of the beamforming IC 101 is not present. For example, the through line 110 can directly connect the output of the DUT 271 to the connector 103 without the intervening internal connection 272.

Figure 7:
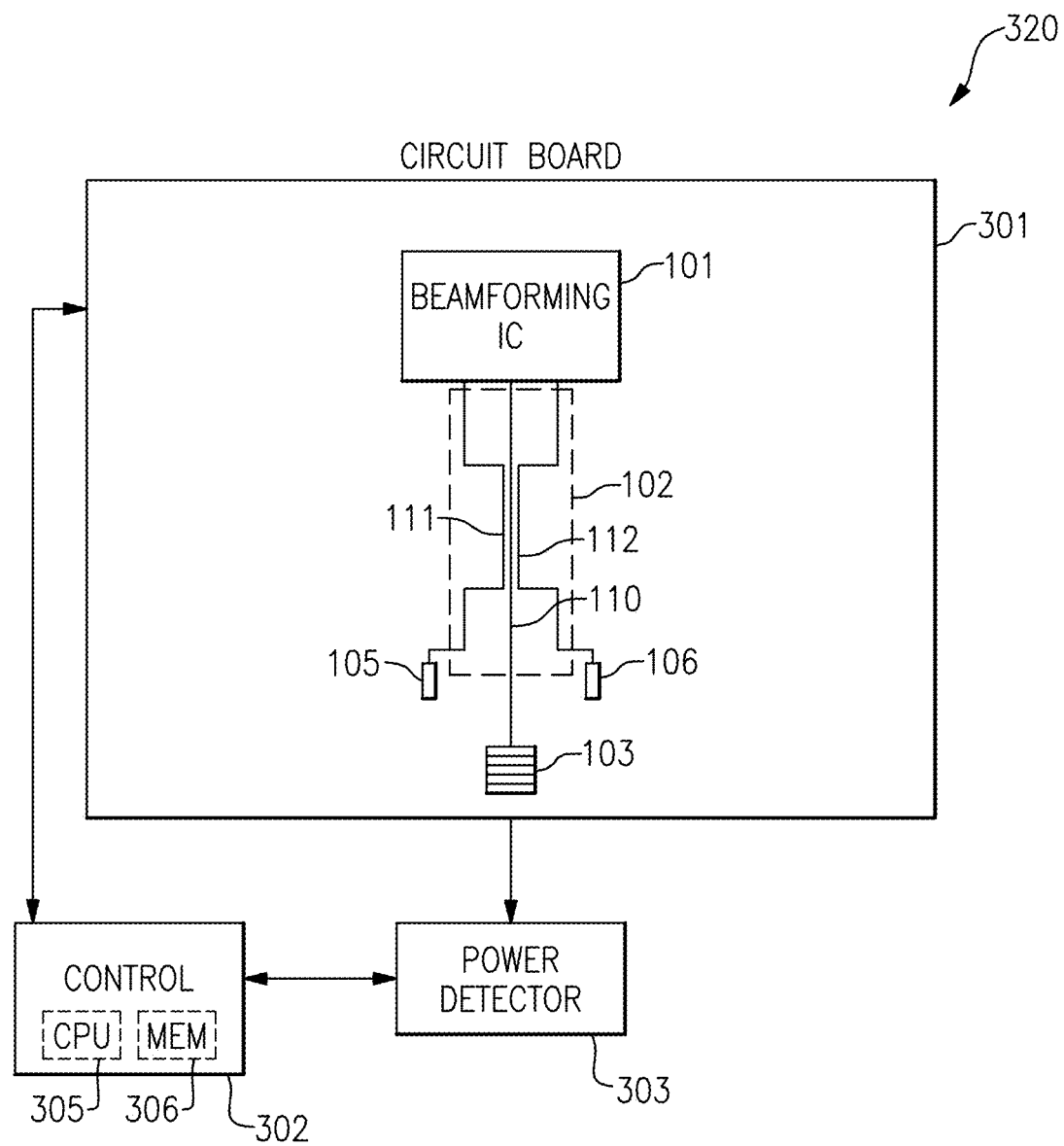
FIG. 7 is a schematic diagram of test equipment according to one embodiment.

FIG. 7 is a schematic diagram of test equipment 320 according to one embodiment. The test equipment 320 includes a circuit board 301, a control circuit 302, and a power detector 303.

As shown in FIG. 7, the circuit board 301 includes an RF coupler 102 formed therein. Additionally, a connector 103, a beamforming IC 101, a first termination impedance 105, and a second termination impedance 106 are connected to the circuit board 301. In the illustrated embodiment, the test equipment 320 is implemented in accordance with the test setup 140 of FIG. 3A. However, other configurations are possible, such as implementations in which the test equipment is implemented in accordance with the test setup 280 of FIG. 6.

The circuit board 301 can also be referred to as an evaluation board. In certain implementations, the circuit board 301 is a PCB in which the RF coupler 312 is formed.

In the illustrated embodiment, the power detector 303 is connected to the connector 103 and serves to analyze signals. For example, the power detector 303 can be used to capture load-pull data from the DUT. Additionally, the power detector 303 is connected to the control circuit 302, which includes a computer processing unit (CPU) 305 and a memory 306.

In certain implementations, the load-pull data captured by the power detector 303 is stored in the memory 306, and the processor 305 processes the load-pull data to construct load-pull contours.

The control circuit 302 can be used to provide control data, such as digital control data, to the circuit board 301. In one example, the control circuit 302 programs the beamforming IC 101 with data instructing the beamforming IC 101 to operate with particular gains and phases for transmit channels, thereby providing impedance tuning.

The memory 306 of the control circuit 302 stores instructions that when executed on the CPU 305 cause the CPU 305 to perform operations for controlling the gain and phase of transmit channels over time to facilitate testing, such as load-pull testing.

Applications

The teachings herein are applicable to testing RF components (for example, RF amplifiers) operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide range radio frequencies, including microwave frequencies.

Moreover, such RF components can wirelessly communicate RF signals associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

CONCLUSION

The foregoing description may refer to elements or features as being "connected". As used herein, unless expressly stated otherwise, "connected" means that one element/feature is directly or indirectly connected to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An electronic testing setup comprising:
a radio frequency (RF) coupler including a through line, a first coupled line coupled to the through line, and a second coupled line coupled to the through line, wherein the through line is configured to receive an RF output signal from an output of a device under test (DUT); and a beamforming integrated circuit (IC) including a first transmit channel having an output connected to the first coupled line, and a second transmit channel having an output connected to the second coupled line, wherein a gain and a phase of the first transmit channel and a gain and a phase of the second transmit channel are each controllable to provide impedance tuning at the output of the DUT.

2. The electronic testing setup of claim 1, wherein the DUT comprises the beamforming IC.

3. The electronic testing setup of claim 2, wherein the beamforming IC further comprises a third transmit channel having an output connected to the through line.

4. The electronic testing setup of claim 1, wherein the first transmit channel includes a first variable gain amplifier a first phase shifter in cascade, and the second transmit channel includes a second variable gain amplifier and a second phase shifter in cascade.

5. The electronic testing setup of claim 1, further comprising a connector, wherein the through line of the RF coupler is connected between the connector and the output of the DUT.

6. The electronic testing setup of claim 1, further comprising a first termination impedance and a second termination impedance, wherein the first coupled line is connected between the first termination impedance and the output of the first transmit channel, and the second coupled line is connected between the second termination impedance and the output of the second transmit channel.

7. The electronic testing setup of claim 1, wherein the DUT includes an RF amplifier configured to drive the output of the DUT, wherein the beamforming IC is configured to provide impedance tuning to perform load-pull measurements on the RF amplifier.

8. The electronic testing setup of claim 1, wherein the first coupled line and the second coupled line are edge coupled to the through line.

9. The electronic testing setup of claim 1, wherein the first coupled line and the second coupled line are broadside coupled to the through line.

10. A circuit board assembly for electronic testing, the circuit board assembly comprising:

a circuit board including a radio frequency (RF) coupler formed thereon, the RF coupler including a through line, a first coupled line coupled to the through line, and a second coupled line coupled to the through line, wherein the through line is configured to receive an RF output signal from an output of a device under test (DUT); and a beamforming integrated circuit (IC) attached to the circuit board, the beamforming IC including a first transmit channel having an output connected to the first coupled line, and a second transmit channel having an output connected to the second coupled line, wherein a gain and a phase of the first transmit channel and a gain and a phase of the second transmit channel are each controllable to provide impedance tuning at the output of the DUT.

11. The circuit board assembly of claim 10, wherein the DUT comprises the beamforming IC.

12. The circuit board assembly of claim 11, wherein the beamforming IC further comprises a third transmit channel having an output connected to the through line.

13. The circuit board assembly of claim 10, wherein the first transmit channel includes a first variable gain amplifier a first phase shifter in cascade, and the second transmit channel includes a second variable gain amplifier and a second phase shifter in cascade.

14. The circuit board assembly of claim 10, further comprising a connector connected to the circuit board, wherein the through line of the RF coupler is connected between the connector and the output of the DUT.

15. The circuit board assembly of claim 10, further comprising a first termination impedance and a second termination impedance connected to the circuit board, wherein the first coupled line is connected between the first termination impedance and the output of the first transmit channel, and the second coupled line is connected between the second termination impedance and the output of the second transmit channel.

16. The circuit board assembly of claim 10, wherein the DUT includes an RF amplifier configured to drive the output of the DUT, wherein the beamforming IC is configured to provide impedance tuning to perform load-pull measurements on the RF amplifier.

17. A method of electronic testing, the method comprising:

providing a radio frequency (RF) output signal from an output of a device under test (DUT) to a through line of an RF coupler;

driving a first coupled line of the RF coupler using an output of a first transmit channel of a beamforming integrated circuit (IC), the first coupled line coupled to the through line;

driving a second coupled line of the RF coupler using an output of a second transmit channel of the beamforming IC, the second coupled line coupled to the through line; and providing impedance tuning at the output of the DUT by controlling each of a gain and a phase of the first transmit channel and a gain and a phase of the second transmit channel.

18. The method of claim 17, wherein the DUT comprises the beamforming IC, and wherein providing the RF output signal from the output of the DUT comprises outputting the RF output signal from a third transmit channel of the beamforming IC.

19. The method of claim 17, wherein the DUT includes an RF amplifier, wherein providing impedance tuning comprises performing load-pull measurements on the RF amplifier.

20. The method of claim 17, wherein providing impedance tuning comprises controlling a first variable gain amplifier a first phase shifter of the first transmit channel, and controlling a second variable gain amplifier and a second phase shifter of the second transmit channel.

* * * * *